United States Patent [19]

Sato et al.

[11] Patent Number: 5,043,676
[45] Date of Patent: Aug. 27, 1991

[54] AUTOMATIC LEVEL CONTROL CIRCUIT

[75] Inventors: Takeshi Sato; Hideo Yamamoto; Toshikazu Yoshimi; Shuichi Mori; Akio Tokumo, all of Saitama, Japan

[73] Assignee: Pioneer Electronic Corporation, Tokyo, Japan

[21] Appl. No.: 89,114

[22] Filed: Aug. 25, 1987

[30] Foreign Application Priority Data

Aug. 25, 1986 [JP] Japan ................................ 61-198630

[51] Int. Cl.$^5$ ............................................. H03F 1/42
[52] U.S. Cl. ...................................... 330/284; 330/306; 333/17.1; 381/29
[58] Field of Search .................... 330/145, 284, 306; 381/29, 101, 102, 103; 333/14, 17 R, 28 T

[56] References Cited

U.S. PATENT DOCUMENTS

| | | | |
|---|---|---|---|
| 3,934,190 | 1/1976 | Dolby | 333/14 X |
| 4,068,139 | 1/1978 | Bray | 333/14 X |
| 4,450,413 | 5/1984 | Fujibayashi | 330/284 X |
| 4,766,395 | 8/1988 | Dolby | 330/145 X |

FOREIGN PATENT DOCUMENTS 3007283 9/1981 Fed. Rep. of Germany .
3502422 7/1986 Fed. Rep. of Germany .

OTHER PUBLICATIONS

*McGraw-Hill Concise Encyclopedia of Science & Technology*, Second Edition, 1989, p. 192.
*Van Nostrand's Scientific Encyclopedia*, Fourth Edition, 1968, p. 156.
Jorgen Pohl, "Kassettentechnik & Dolby Systems'-'—1975.
Geoffrey Shorter, "Dolby Noise Reducer"—May 1975.
Wolfgang Sodtke, "Regelschalungen mit Feldeffekttransistoren"—1969.

*Primary Examiner*—James B. Mullins
*Attorney, Agent, or Firm*—Sughrue, Mion, Zinn, Macpeak & Seas

[57] ABSTRACT

In an ALC circuit for automatically performing an amplitude compression control operation according to the output level of a low frequency amplifier circuit, the output level of the amplifier circuit is subjected to amplitude compression according to the level of a control signal which is outputted in correspondence to the output level of the amplifier circuit. The differentiation time constant of a differentiating circuit (or cutoff frequency of a high pass filter) provided on the output side of the amplifier circuit is controlled according to the level of the control signal to control the cutoff frequency for the frequency band subjected to amplitude compression.

20 Claims, 3 Drawing Sheets

AUTOMATIC LEVEL CONTROL CIRCUIT

BACKGROUND OF THE INVENTION

1. Field of the Invention

This invention relates to an ALC (automatic level control) circuit in a low frequency amplifier circuit.

2. Background of the Invention

When, in a low frequency amplifier, its input level is excessively high, it is necessary to decrease the level at a suitable rate to prevent the saturation of its output.

An example of a conventional ALC circuit will be described with reference to FIG. 4. In FIG. 4, an input terminal 1 is connected through a voltage dividing resistor $R_3$ to an output terminal 12. The output produced at the terminal 12 is also supplied through an output detecting resistor $R_4$ and an output detecting variable resistor $VR_5$ to an amplifier section 6, where it is amplified. The output of the amplifier section 6 is applied through a time constant circuit 7 made up of an R-C (resistor and capacitor) series circuit and through a rectifying and smoothing circuit 8 to the base of a transistor $TR_{10}$ Darlington-connected with a transistor $TR_{11}$. The collector of the transistor $TR_{10}$ is connected to a positive power source $+B$ and its emitter is connected to the base of the transistor $TR_{11}$. The collector of the transistor $TR_{11}$ is connected to an output line, i.e., the output terminal 12. That is, the ALC circuit is so designed as to operate as a variable impedance to control the attenuation according to the input level.

The operation of the conventional ALC circuit thus organized will now be described. When the input level is low, a control signal produced from the output line is also low in level and therefore the transistor $TR_{10}$ is maintained non-conductive (off) and the transistor $TR_{11}$ is also non-conductive, i.e, the transistor $TR_{11}$ has a high impedance between its emitter and collector. Accordingly, the output provided on the output line will not be decreased by the transistor $TR_{11}$. That is, the output level is not decreased in this case.

When, on the other hand, the input level is increased to render the transistor $TR_{10}$ conductive (on), the transistor $TR_{11}$ is also rendered conductive by a current which is supplied from the positive power source according to the base-emitter current of the transistor $TR_{10}$. That is, the transistor $TR_{11}$ assumes a low impedance between its emitter and collector. Accordingly, the output provided on the output line is decreased by the transistor $TR_{11}$. That is, the output level is decreased. FIG. 5 shows one example of frequency v. gain characteristics in this operation, in which the ordinate axis represents overall gain defined by dividing an output level by an input level. When the input level is low, the amount of control is small whereas when the input level is high, the amount of control is large, yet providing substantially flat frequency characteristic curves.

In this conventional ALC circuit, because of the circuitry described above, the level attenuation occurs over all the frequency bands concerned. That is, the operation of the ALC circuit makes a person feel the high frequency level variation which is offensive to the ear, thus causing a so-called "breezing phenomenon".

When an excessively large input is applied, especially a low frequency band must be taken into consideration because of the following reason. In general, the ALC operation is often required when a high frequency signal is superposed on a low frequency signal. Since, in terms of acoustic power, a high frequency signal is lower in level than a lower frequency signal, it is unnecessary to perform an ALC operation for all the frequency bands.

Furthermore, the ALC control carried out for each channel suffers from the following difficulty. In the case where two channels, i.e., right and left channels in a stereophonic mode, have different high frequency component attenuation from each other, high frequency components in particular, having significant directivity, adversely affect the sound image localization, thus making a person uncomfortable.

SUMMARY OF THE INVENTION

Accordingly, an object of this invention is to eliminate the above-described difficulties accompanying a conventional ALC circuit.

The foregoing object and other objects of the invention have been achieved by the provision of an ALC circuit for automatically performing an amplitude compression control operation according to the output level of a low frequency amplifier circuit. According to the invention, the ALC circuit comprises a control signal generator for providing a control signal corresponding to the output level of the low frequency amplifier circuit; an amplitude compression controller for subjecting the output level to amplitude compression according to the level of the control signal, and a differentiating circuit provided on the output side of the low frequency amplifier circuit. The differentiation time constant of the differentiating circuit is controlled according to the level of the control signal to control a cutoff frequency for a frequency band subjected to amplitude compression.

The nature, utility and principle of the invention will be more clearly understood from the following detailed description when read in conjunction with accompanying drawings.

DETAILED DESCRIPTION OF THE INVENTION

Figure 4:
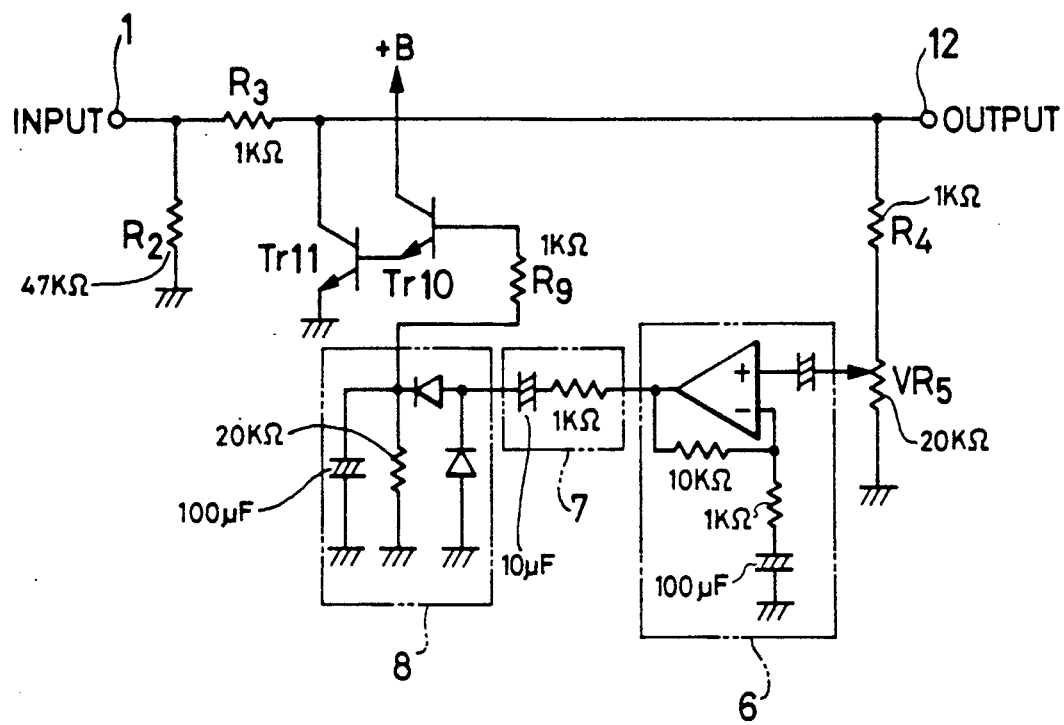
FIG. 4 is a circuit diagram showing an example of a conventional ALC circuit.
Figure 5:
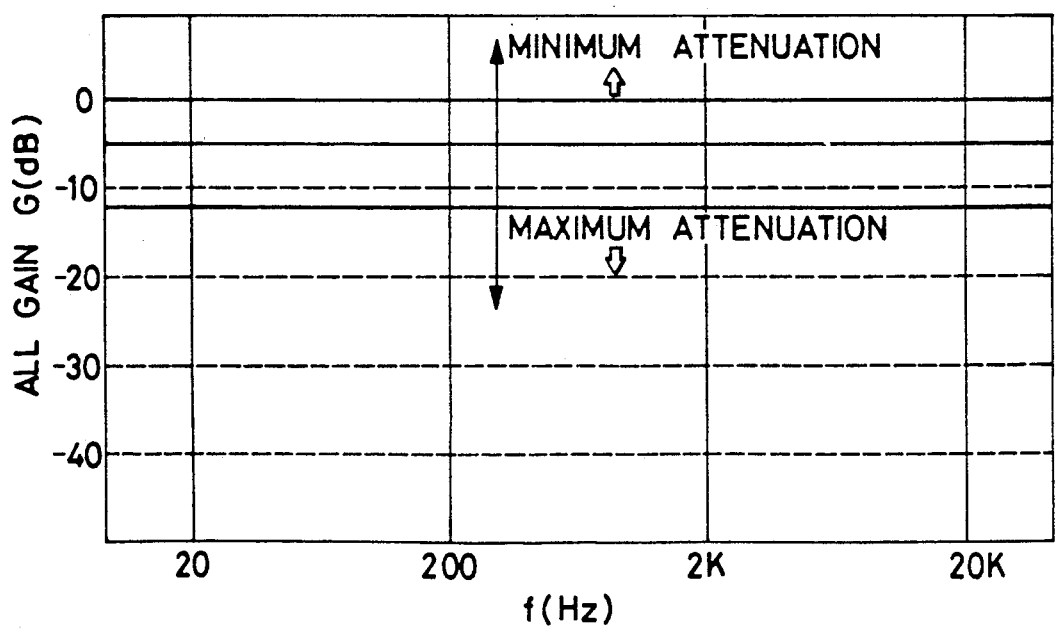
FIG. 5 is a characteristic diagram for a description of the operation of the conventional ALC circuit shown in FIG. 4.

A first example of an ALC circuit according to the invention will be described with reference to FIG. 1, in which those circuit elements which have been previously described with reference to FIG. 4 are therefore designated by the same reference numerals or characters.

Figure 1:
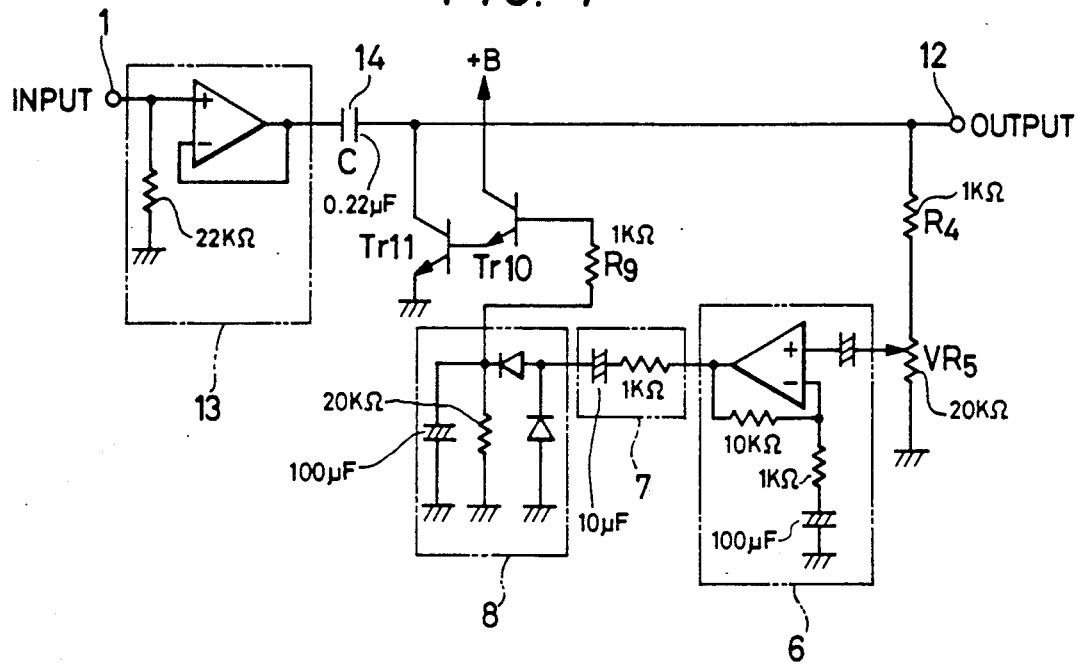
FIG. 1 is a circuit diagram showing a first example of an ALC circuit according to this invention.

In FIG. 1, an input buffer circuit 13 is connected between the input terminal 1 and a capacitor 14 connected in series with the output line. The capacitor 14 and the collector-emitter resistance of the Darlington-connected transistor $TR_{11}$ form a voltage dividing circuit, the voltage division output of which is applied to the output terminal 12. Similarly as in the conventional ALC circuit described before, the output provided at the output terminal is supplied through the amplifier circuit 6, the time constant circuit 7 and the rectifying and smoothing circuit 8 to the base of the transistor $TR_{10}$. That is, the transistor $TR_{10}$ is driven according to the output level.

In the ALC circuit thus organized, the capacitor 14 and the collector-emitter resistance of the transistor $TR_{11}$ further form a high pass filtering circuit. In the high pass filtering circuit, since the collector-emitter resistance of the transistor $TR_{11}$ changes with the control signal level the filtering RC time constant is changed. In this way, the frequency band subjected to amplitude compression and the compressed level in the frequency band are changed. More specifically, if the filtering time constant is small, the cutoff frequency is increased and frequencies lower than the cutoff frequency are attenuated. This filtering circuit acts as a differentiating circuit at low frequencies. Namely, the transfer function is proportional to the frequency at frequencies well below the cutoff frequency.

Accordingly, as the input signal level increases, the collector-emitter resistance Of the transistor $TR_{11}$ is decreased, the filter time constant is decreased, and the cutoff frequency is increased so that attenuation is carried out to high frequencies. That is, the range of level attenuation is extended to higher frequencies, but will not be extended so high as to adversely affect high frequency components. When, on the other hand, the input signal level is low, the collector-emitter resistance of the transistor $TR_{11}$ is high, the filtering time constant is large, and the cutoff frequency is low, so that no attenuation is effected even in the low frequency range.

Figure 2:
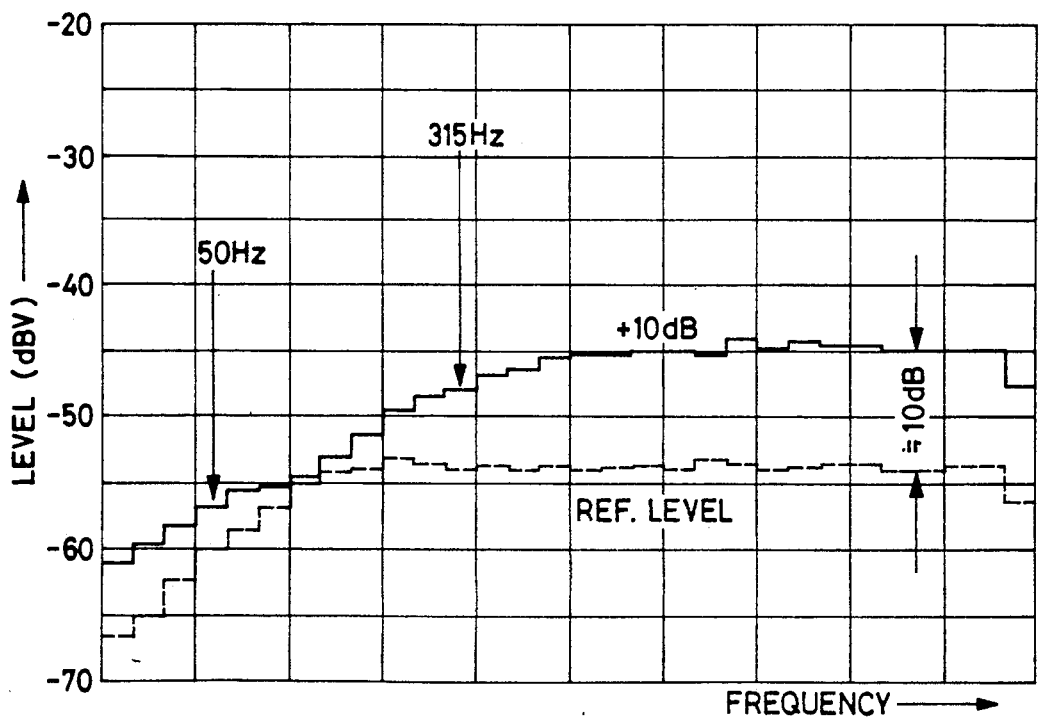
FIG. 2 is a characteristic diagram for a description of the operation of the ALC circuit shown in FIG. 1.

FIG. 2 shows the results of experiments performed with the above-described circuit. FIG. 2 shows the case where a high level input (indicated by the solid line) is higher by 10 dB than a low level reference level (indicated by the dotted line). When these signals are applied to the ALC circuit of the invention, the cutoff frequency is 50 Hz for the input reference level but is increased to 315 Hz for the input signal which is higher by 10 dB in level.

Figure 3:
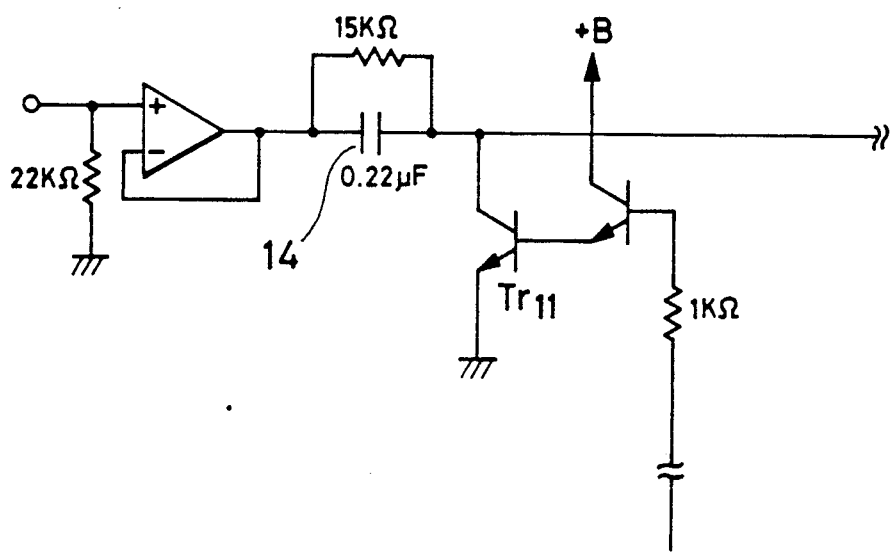
FIG. 3 is a circuit diagram showing a second example of the ALC circuit according to the invention.

In the above-described ALC circuit, the voltage dividing circuit made up of the series-connected capacitor 14 and the collector-emitter resistance of the transistor $TR_{11}$ serves also as a high pass filter circuit whose cutoff frequency is variable. However, the ALC circuit may be so modified that, as shown in FIG. 3, the capacitor 14 is shunted by resistor so that an upper limit is given to the attenuation in the low frequency range.

As was described above, in the ALC circuit of the invention, the high pass filtering circuit made up of the series-connected capacitor and the collector-emitter of the resistance of the transistor which changes with the input level can change the cutoff frequency of a frequency band subjected to amplitude compression. As a result, no amplitude compression is given to a frequency band higher than the cutoff frequency. Therefore, the breezing due to the variation in level of high frequency components or the fluctuation in sound image localization due to the difference in level between channels is never caused. Due to the nature of the low frequency component, the sound image localization does not tend to occur. Hence, the ALC circuit of the invention can perform ALC control satisfactorily at all times.

What is claimed is:

1. An automatic level control (ALC) circuit for automatically performing amplitude compression on an audio input signal having both low frequency and high frequency components within an audio frequency range, and for providing a level-controlled audio output signal, said ALC circuit comprising:
    control signal generating means for outputting a control signal corresponding to a level of said level-controlled audio output signal; and
    amplitude compression means for cutting off low frequency components of said level-controlled audio output signal below a predetermined frequency while passing said high frequency components from said audio input signal to said level-controlled audio output signal at all times without substantial attenuation, said predetermined frequency being varied by said control signal, and wherein said predetermined frequency is variable over a range which includes frequencies on the order of 315 Hz.

2. An ALC circuit as recited claim 1, wherein said amplitude compression means is a high pass filter with a variable cutoff frequency and said cut off frequency is controlled by said control signal.

3. An ALC circuit as recited in claim 2, wherein said high pass filter has a transfer function proportional to a frequency of said audio signal substantially less than said cutoff frequency.

4. An ALC circuit as recited in claim 2, wherein said high pass filter has a substantially flat transfer function in a frequency band with frequencies substantially less than said cutoff frequency.

5. An ALC circuit as recited in claim 1, wherein said amplitude compression means is a differentiating circuit.

6. An ALC circuit is recited in claim 5, wherein said differentiating circuit comprises:
    a capacitor receiving on a first terminal said audio signal; and
    two Darlington-connected transistors connected to a second terminal of said capacitor, said control signal being applied to a base of said Darlington-connected transistors.

7. An ALC circuit as recited in claim 6, wherein an input terminal to said control signal generating means and an output terminal of said ALC circuit are connected to said second terminal of said capacitor.

8. An automatic level control (ALC) circuit for automatically performing amplitude compression on an audio signal having both low frequency and high frequency components within an audio frequency range, comprising:
    control signal generating means for outputting a control signal corresponding to a level of said audio signal; and
    amplitude compression means for subjecting a variable frequency band of said low frequency component of said audio signal to amplitude compression while passing said high frequency component at all times without substantial attenuation, said frequency band being varied by said control signal over a range which includes frequencies on the order of 315 Hz, said amplitude compression means comprising a high pass filter with a variable cutoff frequency and said cutoff frequency is controlled by said control signal, said high pass filter having a transfer function proportional to a frequency of said audio signal substantially less than said cutoff frequency.

9. An automatic level control (ALC) circuit for receiving an input signal having both low frequency and high frequency components within an audio frequency range and automatically performing amplitude compression on said input signal to provide an output audio signal, said circuit comprising:
   a buffer amplifier for receiving said input signal;
   amplitude compression means coupled to the output of said buffer amplifier for subjecting a variable frequency band of said low frequency component of said input signal to amplitude compression while passing said high frequency components at all times without substantial attenuation to produce said output audio signal, said frequency band being varied by a control signal over a range which includes frequencies on the order of 315 Hz; and
   control signal generating means for outputting a control signal corresponding to a level of said output audio signal.

10. An automatic level control (ALC) circuit for automatically performing amplitude compression on an audio signal having both low frequency and high frequency components and representing sound, comprising:
   capacitance means (14) having an input terminal for receiving said audio signal as an input and an output terminal for providing an output audio signal to be reproduced as said sound;
   control signal generating means d.c. coupled to said output terminal of said capacitance means for providing a control signal corresponding to a level of said output audio signal; and
   variable resistance means responsive to said control signal for varying a d.c. resistance between said output terminal and a reference voltage to cut off said low frequency components of said audio signal below a predetermined frequency while passing said high frequency components at all times without substantial attenuation, said predetermined frequency being varied by said control signal over a range which includes frequencies on the order of 315 Hz.

11. An automatic level control (ALC) circuit for automatically performing amplitude compression on an audio input signal having both low frequency and high frequency components within an audio frequency range, and for providing a level-controlled audio output signal, said ALC circuit comprising:
   control signal generating means for outputting a control signal corresponding to a level of said level-controlled audio output signal; and
   amplitude compression means for cutting off low frequency components of said level-controlled audio output signal below a predetermined frequency while passing said high frequency components from said audio input signal to said level-controlled audio output signal at all times without substantial attenuation, said predetermined frequency being varied by said control signal, and wherein said predetermined frequency is variable over a range which includes frequencies on the order of 50 Hz.

12. An ALC circuit as recited in claim 11, wherein said amplitude compression means is a high pass filter with a variable cutoff frequency and said cut off frequency is controlled by said control signal.

13. An ALC circuit as recited in claim 12, wherein said high pass filter has a transfer function proportional to a frequency of said audio signal substantially less than said cutoff frequency.

14. An ALC circuit as recited in claim 12, wherein said high pass filter has a substantially flat transfer function in a frequency band with frequencies substantially less than said cutoff frequency.

15. An ALC circuit as recited in claim 11, wherein said amplitude compression means is a differentiating circuit.

16. An ALC circuit as recited in claim 15, wherein said differentiating circuit comprises:
   a capacitor receiving on a first terminal said audio signal; and
   two Darlington-connected transistors connected to a second terminal of said capacitor, said control signal being applied to a base of said Darlington-connected transistors.

17. An ALC circuit as recited in claim 16, wherein an input terminal to said control signal generating means and an output terminal of said ALC circuit are connected to said second terminal of said capacitor.

18. An automatic level control (ALC) circuit for automatically performing amplitude compression on an audio signal having both low frequency and high frequency components within an audio frequency range, comprising:
   control signal generating means for outputting a control signal corresponding to a level of said audio signal; and
   amplitude compression means for subjecting a variable frequency band of said low frequency component of said audio signal to amplitude compression while passing said high frequency component at all times without substantial attenuation, said frequency band being varied by said control signal over a range which includes frequencies on the order of 50 Hz, said amplitude compression means comprising a high pass filter with a variable cutoff frequency and said cutoff frequency is controlled by said control signal, said high pass filter having a transfer function proportional to a frequency of said audio signal substantially less than said cutoff frequency.

19. An automatic level control (ALC) circuit for receiving an input signal having both low frequency and high frequency components within an audio frequency range and automatically performing amplitude compression on said input signal to provide an output audio signal, said circuit comprising:
   a buffer amplifier for receiving said input signal;
   amplitude compression means coupled to the output of said buffer amplifier for subjecting a variable frequency band of said low frequency component of said input signal to amplitude compression while passing said high frequency components at all times without substantial attenuation to produce said output audio signal, said frequency band being varied by a control signal over a range which includes frequencies on the order of 50 Hz; and
   control signal generating means for outputting a control signal corresponding to a level of said output audio signal.

20. An automatic level control (ALC) circuit for automatically performing amplitude compression on an audio signal having both low frequency and high frequency components and representing sound, comprising:

capacitance means (14) having an input terminal for receiving said audio signal as an input and an output terminal for providing an output audio signal to be reproduced as said sound;

control signal generating means d.c. coupled to said output terminal of said capacitance means for providing a control signal corresponding to a level of said output audio signal; and variable resistance means responsive to said control signal for varying a d.c. resistance between said output terminal and a reference voltage to cut off said low frequency components of said audio signal below a predetermined frequency while passing said high frequency components at all times without substantial attenuation, said predetermined frequency being varied by said control signal over a range which includes frequencies on the order of 50 Hz.

* * * * *